United States Patent
Hino

(10) Patent No.: US 6,276,731 B1
(45) Date of Patent: Aug. 21, 2001

(54) WAFER CARRYING FORK

(75) Inventor: Kazunori Hino, Kitakyushu (JP)

(73) Assignee: Kabushiki Kaisha Yaskawa Denki, Fukuoaka (JP)

(*) Notice: Subject to any disclaimer, the term of this patent is extended or adjusted under 35 U.S.C. 154(b) by 0 days.

(21) Appl. No.: 09/462,820

(22) PCT Filed: Jul. 15, 1997

(86) PCT No.: PCT/JP97/02454

§ 371 Date: Mar. 20, 2000

§ 102(e) Date: Mar. 20, 2000

(87) PCT Pub. No.: WO99/04426

PCT Pub. Date: Jan. 28, 1999

(51) Int. Cl.⁷ .................................................. B65G 49/07
(52) U.S. Cl. ............................................ 294/1.1; 414/941
(58) Field of Search ............ 294/1.1, 32; 414/935–939, 414/941

(56) References Cited

U.S. PATENT DOCUMENTS

| | | | |
|---|---|---|---|
| 5,061,144 | * 10/1991 | Akimoto et al. | 414/935 |
| 5,445,486 | * 8/1995 | Kitayama et al. | 294/1.1 |
| 5,647,626 | * 7/1997 | Chen et al. | 294/1.1 |
| 5,669,644 | * 9/1997 | Kaihotsu et al. | 414/941 |
| 5,711,646 | * 1/1998 | Ueda et al. | 414/941 |
| 5,746,460 | * 5/1998 | Marohl et al. | 414/941 |

FOREIGN PATENT DOCUMENTS 8-313856 * 11/1996 (JP).

* cited by examiner

Primary Examiner—Dean J. Kramer
(74) Attorney, Agent, or Firm—Armstrong, Westerman, Hattori, McLeland & Naughton, LLP

(57) ABSTRACT

A wafer carrying fork on which a wafer rests and carried and which comprises a wafer resting surface (2) provided on the top surface of a wafer carrying fork (1), and two steps (3, 4) provided on the outer sides of the wafer resting surface (2) in a stepwise manner and having a height to width ratio of 1:0.5 to 1:2. Accordingly, it is possible to have a wafer (6) surely rest on the wafer carrying fork (1), even when the wafer (6) gets out of position in a wafer cassette, to convey it without failing.

1 Claim, 2 Drawing Sheets

WAFER CARRYING FORK

FIELD OF THE INVENTION

The present invention relates to a wafer carrying fork with a wafer rested on a wafer resting surface.

BACKGROUND OF THE INVENTION

A prior art wafer carrying fork is constructed as shown in FIG. 5. In the same drawing, numeral 10 identifies a wafer carrying fork which is provided with a wafer resting surface 11 on the top thereof. Further, a tapered projection 12 is formed at the outer side of the wafer resting surface 11 so that a wafer does not fall down.

The wafer 13 is placed and rested on the wafer resting surface 11 and is transferred or carried.

However, some of a plurality of wafers 13 accommodated in a wafer cassette (not illustrated) are accommodated out of position. In this case, as shown in FIG. 6, the wafer 13 is inclined and placed between the wafer resting surface and the tapered projection.

Such a problem occurs by which, if a wafer is conveyed in this state, the wafer 13 resting on the wafer carrying fork 10 slips and falls down from the wafer carrying fork 10.

Therefore, although the projection 12 is lengthened to prevent the wafer 13 from falling down, another problem arises, in which the thickness of the projection 12 of the wafer carrying fork 10 is increased.

SUMMARY OF THE INVENTION

It is therefore an object of the invention to provide a wafer carrying fork which is capable of conveying a wafer without falling down from the wafer carrying fork and without increasing the thickness of the tapered projection of the wafer carrying fork.

In order to achieve the above object, a wafer carrying fork for conveying a wafer with a wafer rested thereon according to the invention is provided with a wafer resting surface on the top surface of the wafer carrying fork and two steps secured in a stepwise manner at the outer side of the wafer resting surface, and vertically erect at a height dimension which is the same as the thickness dimension of the wafer, wherein a ratio of the width of an inner step to the height of an outer step is 1:0.5 through 1:2.

Therefore, according to the invention, it is possible to securely convey a wafer, wherein since the circumferential edge of a wafer is brought into contact with the perpendicular side of the outer step even though a wafer gets out of position in a wafer cassette and the wafer is placed on the wafer resting surface and the inner step in an inclined state, the wafer does not fall down from the wafer carrying fork.

DESCRIPTION OF A PREFERRED EMBODIMENT OF THE INVENTION

Hereinafter, a detailed description is given of preferred embodiments of the invention.

Figure 1:
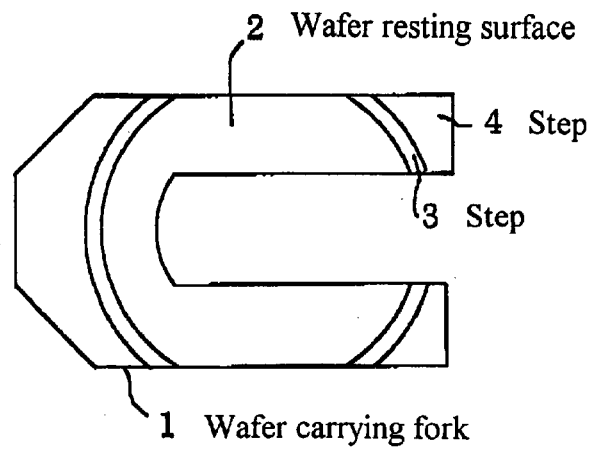
FIG. 1 is a plan view of a wafer carrying fork in compliance with a first preferred embodiment of the invention.
Figure 2:
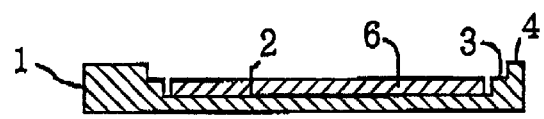
FIG. 2 is a side sectional view of a wafer carrying fork, in a state where a wafer correctly rests, in the first preferred embodiment of the invention.
Figure 3:
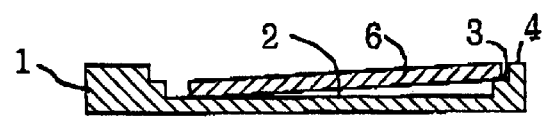
FIG. 3 is a side sectional view of a wafer carrying fork where a wafer rests in an inclined state.

FIG. 1 is a plan view of a wafer carrying fork showing the first embodiment of the invention, FIG. 2 is a side sectional view of a wafer carrying fork, showing a state where a wafer correctly rests, in the first preferred embodiment of the invention, and FIG. 3 is a side sectional view of a wafer carrying fork showing a state where a wafer rests in an inclined state.

In these drawings, 1 is a wafer carrying fork, on which a wafer resting surface 2 is adopted to rest a wafer thereon two vertically erect steps 3 and 4 are provided in a stepwise manner at a height dimension which is the same as the thickness dimensions of a wafer. Also, the ratio of the width of the inner step 3 and the height of the outer step 4 is set to 1:1.

A wafer carrying fork 1, thus constructed, is attached to an arm of a wafer carrying robot (not illustrated), and as shown in FIG. 2, a wafer 6 is placed on the wafer resting surface 2 of the wafer carrying fork 1 for conveyance. Even though a wafer gets out of position in a wafer cassette, and, as shown in FIG. 3, a wafer 6 on the wafer carrying fork 1 is caused to rest on the wafer resting surface 2 and the inner step 3 in an inclined state, the circumferential edge of the wafer 6 is brought into contact with the vertically erect side of the outer step 4 outside the step 3, and the wafer 6 never falls down from the wafer carrying fork 1.

Figure 4:
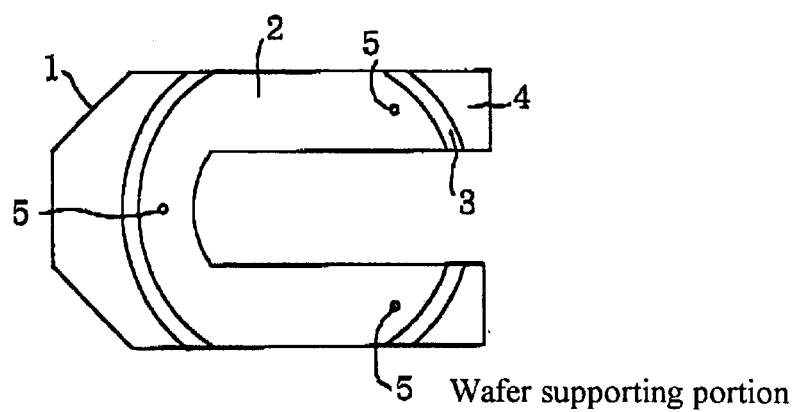
FIG. 4 is a plan view of a wafer carrying fork showing a second preferred embodiment of the invention.

FIG. 4 is a plan view of a wafer carrying fork based on the second embodiment of the invention, wherein a wafer supporting portion 5 made of a friction material is provided on the wafer resting surface 2 in a protruded state. Therefore, even though a wafer 6 is placed on the wafer supporting portion 5 and step 3 in an inclined state, the wafer 6 does not fall down by virtue of a friction force of the wafer supporting portion 5. Provisionally, if a wafer 6 resting on the wafer supporting portion 5 slips, the wafer 6 is brought into contact with the side of the step 4 outside the step 3 and completely stops at the step 4, whereby a wafer 6 can be conveyed without falling down from the wafer carrying fork 1.

Industrial Applicability

The invention can be utilized in production and proposal of a wafer carrying fork which is capable of securely conveying a wafer even though the wafers get out of position in a wafer cassette where it is applied to a wafer carrying fork for conveying a wafer with the wafer resting thereon.

FIG. 1
- 2 Wafer resting surface
- 4 Step
- 3 Step
- 1 Wafer carrying fork

FIG. 2

FIG. 3

Figure 5:
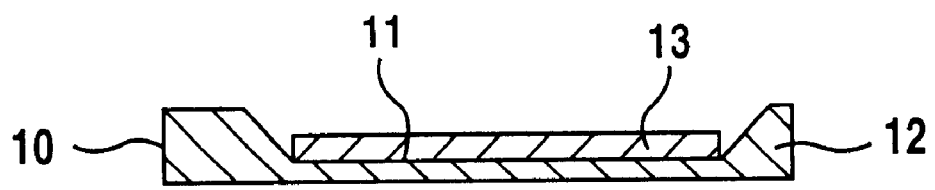
FIG. 5 is a side sectional view of a wafer carrying fork of the prior art in a state where a wafer correctly rests.
Figure 6:
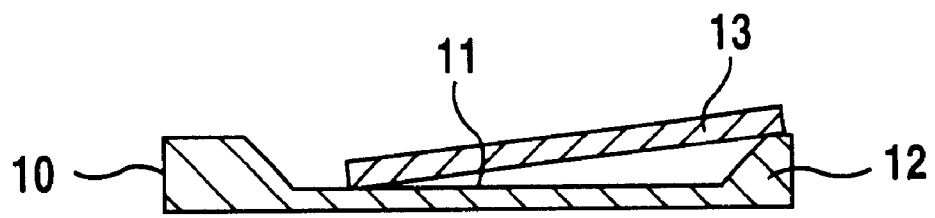
FIG. 6 is a side sectional view of a wafer carrying fork where a wafer rests in an inclined state.

FIG. 4
- 5 Wafer supporting portion

FIG. 5

FIG. 6

What is claimed is:

1. A wafer carrying fork for conveying a wafer with the wafer resting thereon, said wafer carrying fork comprising:

a top surface of said fork providing a surface operative to receive said wafer and to provide surface-to-surface resting support to a face thereof substantially from one end of said wafer to the other end thereof;

a pair of opposed, spaced stepped portions disposed each at opposite ends of said top surface;

each said stepped portion containing two vertically spaced, transversely extending steps disposed in a stepwise manner to define a pair of spaced, oppositely facing inner steps forming abutments against movement of a wafer carried by said fork top surface extending upwardly from said fork top surface and a pair of opposed, spaced outer steps extending upwardly from said inner steps forming abutments against movement of a wafer displaced from said fork top surface;

a height dimension between each of said vertically spaced steps being substantially the same dimension as a thickness dimension of a wafer to be carried on said fork; and the ratio of a width of each inner step to a height of each outer step in each stepped portion being in a range from 1 to 0.5 to 1 to 2.

* * * * *